(12) United States Patent
Colli

(10) Patent No.: US 9,153,764 B2
(45) Date of Patent: Oct. 6, 2015

(54) APPARATUS FOR TRANSDUCING A SURFACE ACOUSTIC WAVE

(75) Inventor: Alan Colli, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 244 days.

(21) Appl. No.: 13/042,894

(22) Filed: Mar. 8, 2011

(65) Prior Publication Data

US 2012/0228993 A1    Sep. 13, 2012

(51) Int. Cl.
*H01L 41/047*    (2006.01)
*H01L 41/113*    (2006.01)

(52) U.S. Cl.
CPC .......... *H01L 41/0478* (2013.01); *H01L 41/113* (2013.01)

(58) Field of Classification Search
CPC ...... H03H 9/059; H03H 3/08; H03H 9/14547
USPC ....... 310/313 R, 313 A, 313 B, 313 C, 313 D
See application file for complete search history.

(56) References Cited

U.S. PATENT DOCUMENTS

| | | | |
|---|---|---|---|
| 4,065,736 A | 12/1977 | London | 333/72 |
| 6,178,275 B1* | 1/2001 | Nerses et al. | 385/14 |
| 6,339,277 B1* | 1/2002 | Iwamoto et al. | 310/313 R |
| 7,554,242 B2* | 6/2009 | Aoki et al. | 310/313 B |
| 7,573,178 B2* | 8/2009 | Inoue et al. | 310/313 R |
| 2006/0014202 A1* | 1/2006 | Watanabe et al. | 435/6 |
| 2008/0230859 A1 | 9/2008 | Zaghloul et al. | 257/428 |
| 2009/0246625 A1* | 10/2009 | Lu | 429/207 |
| 2010/0021708 A1 | 1/2010 | Kong et al. | 428/220 |

FOREIGN PATENT DOCUMENTS

| | | |
|---|---|---|
| CN | 1525640 A | 9/2004 |
| EP | 1 453 198 A2 | 9/2004 |
| WO | WO-2009/121901 A1 | 10/2009 |
| WO | WO-2012/089416 A1 | 7/2012 |

OTHER PUBLICATIONS

Rimeika R; Chivukula V; Shur M S; Kim J H: Surface acoustic waves in grapheme structures: Response to ambient humidity (Proceedings of IEEE Sensors—IEEE Sensors 2010 Conference, Sensors 2010, pp. 785-788).
Colli, "Surface Acustic-Wave Grapheme Radio (Supporting information and comments)", (Jul. 12, 2010), (6 pages).
Kim, et al, "Quantization of the Current Induced by a Surface Acoustic Wave through a Quantum Point Contact", Journal of the Korean Physical Society, vol. 50, No. (May 5, 2007), (pp. 1290-1293).
Robinson, et al, "Commensurability Oscillations in the Surface-Acoustic-Wave-Induced Acoustoelectric Effect in a Two-Dimensional Electron Gas", (2005), (pp. 241301-1 through 241301-4).

(Continued)

*Primary Examiner* — Shawki S Ismail
*Assistant Examiner* — Bryan Gordon
(74) *Attorney, Agent, or Firm* — Harrington & Smith

(57) ABSTRACT

An apparatus including a piezoelectric substrate configured to propagate a surface acoustic wave; and a transducer, coupled to the piezoelectric substrate, including at least one graphene electrode configured to transduce a propagating surface acoustic wave to an electrical signal.

17 Claims, 4 Drawing Sheets

(56) References Cited

OTHER PUBLICATIONS

Utko, et al, "An improved 2.5GH$_z$ Electron Pump: Single-Electron Transport Through Shallow-Etched Point Contacts Driven by Surface Acoustic Waves", (Jun. 2003), (11 pages).

Colli, "Surface Acustic-Wave Grapheme Radio (Invention Report)", (Sep. 11, 2010), (11 pages).

"Acoustically induced current flow in grapheme", V. Miseikis, et al., Applied Physics Letters 100, 133105, (2012), 4 pgs.

* cited by examiner

APPARATUS FOR TRANSDUCING A SURFACE ACOUSTIC WAVE

TECHNOLOGICAL FIELD

Embodiments of the present invention relate to an apparatus for transducing a surface acoustic wave.

BACKGROUND

Although apparatus for transducing a surface acoustic wave to an electrical signal are known they typically produce as an output an alternating electrical signal that varies with the surface acoustic waves amplitude.

If the surface acoustic wave has a high frequency then the output electrical signal will alternate with a high frequency. This can make utilization of the output signal difficult as conventional silicon based semiconductor devices are not responsive enough for high frequency operation.

BRIEF SUMMARY

According to various, but not necessarily all, embodiments of the invention there is provided an apparatus comprising: a piezoelectric substrate configured to propagate a surface acoustic wave; and a transducer, coupled to the piezoelectric substrate, comprising at least one graphene electrode configured to transduce a propagating surface acoustic wave to an electrical signal.

According to various, but not necessarily all, embodiments of the invention there is provided an apparatus comprising: a piezoelectric substrate configured to propagate a surface acoustic wave; a transducer, coupled to the piezoelectric substrate, and configured to transduce a propagating surface acoustic wave to a electrical potential; and a ground potential node configured to provide a ground potential that is independent of the surface acoustic wave, wherein the transducer comprises a two-dimensional electrode having an electric field dependent conductivity and configured to transduce a propagating surface acoustic wave to an electrical signal.

According to various, but not necessarily all, embodiments of the invention there is provided an apparatus comprising: a piezoelectric substrate configured to propagate a surface acoustic wave; transducer, coupled to the piezoelectric substrate, comprising at least one electrode configured to transduce a propagating surface acoustic wave to a electrical signal; and a ground potential reference node configured to provide a ground potential reference that is independent of the surface acoustic wave, wherein the electrode is coupled to the piezoelectric substrate and has a conductivity that is dependent upon a coupled electric field such that a varying electric field at the piezoelectric substrate, caused by a propagating surface acoustic wave, is coupled to the electrode and varies the conductivity of the electrode.

According to various, but not necessarily all, embodiments of the invention there is provided an apparatus comprising: a piezoelectric substrate configured to propagate a surface acoustic wave; transducer, coupled to the piezoelectric substrate, and configured to transduce a propagating surface acoustic wave to a direct current electrical potential; and a ground potential node configured to provide a ground potential that is independent of the surface acoustic wave.

According to various, but not necessarily all, embodiments of the invention there is provided an apparatus comprising: a piezoelectric substrate configured to propagate a surface acoustic wave; transducer, coupled to the piezoelectric substrate, and configured to transduce a propagating surface acoustic wave to an output direct current electrical potential.

BRIEF DESCRIPTION

For a better understanding of various examples of embodiments of the present invention reference will now be made by way of example only to the accompanying drawings in which.

DETAILED DESCRIPTION

Figure 1:
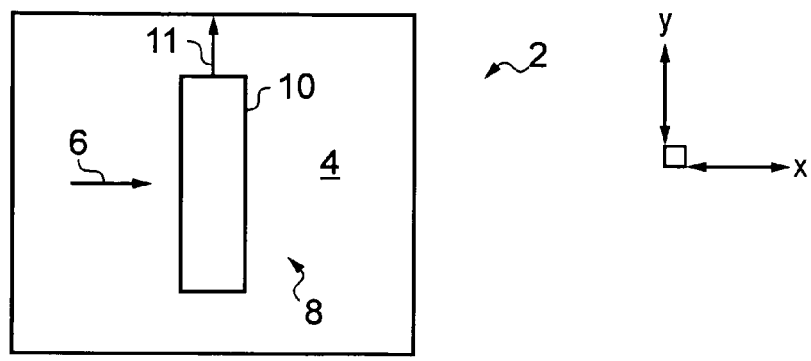
FIG. 1 illustrates an example of an apparatus.

The Figures illustrate an apparatus 2 comprising: a piezoelectric substrate 4 configured to propagate a surface acoustic wave 6 and a transducer 8, coupled to the piezoelectric substrate 4, and configured to transduce a propagating surface acoustic wave 6 to an electrical signal 11.

A surface acoustic wave 6 is an acoustic wave traveling along the surface of a material exhibiting elasticity. Typically the surface acoustic wave causes lattice displacement of the material. When the material is a piezoelectric substrate 4, the local displacements caused by the surface acoustic wave cause local variations in electric potential. The electric potential may be coupled to an electrode 10 of a transducer 8. The electrode 10 may be charged as a plate of a capacitor without the transfer of free charge across an interface between the electrode 10 and piezoelectric substrate 4.

FIG. 1 illustrates an example of an apparatus 2. The apparatus 2 comprises a graphene electrode 10 formed over a piezoelectric substrate 4.

The piezoelectric substrate is configured to propagate a surface acoustic wave 6 in a first direction X. The piezoelectric substrate may, for example, be formed from quartz, lithium niobate, lithium tantalite, lanthanum gallium silicate etc.

The graphene electrode 10, in this example, extends lengthwise in a second direction Y that is orthogonal to the first direction X. The electrode 10 is capacitative coupled to the piezoelectric substrate 4 and transduces the propagating surface acoustic wave 6 to an electrical signal 11.

The graphene electrode may be formed from a two-dimensional graphene ribbon. Graphene has an advantage in that the component fabrication is possible using similar processing methods as is used for CMOS circuits, such as lithography. The graphene may be a two-dimensional (2D) monolayer. Monolayer graphene is a semi-metal (a semiconductor with zero band gap) in it's pristine state without any treatments.

The graphene electrode 10 forms a transducer 8 which operates at room temperature. It transduces a propagating surface acoustic wave 6 to an electrical signal 11.

Figure 2A:
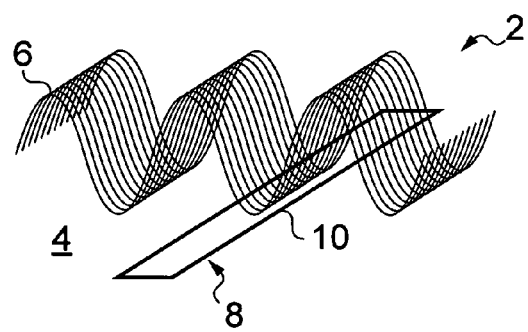
FIG. 2A illustrates an example of an apparatus at a first moment in time.
Figure 2B:
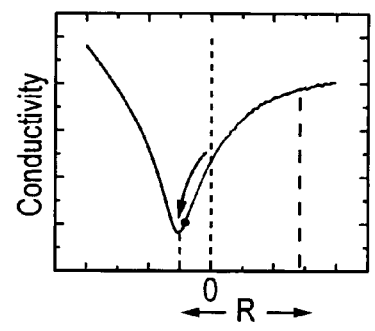
FIG. 2B illustrates the conductivity of a graphene electrode at the first moment in time on a plot illustrating how conductivity varies with electric field for the apparatus illustrated in FIG. 2A.
Figure 3A:
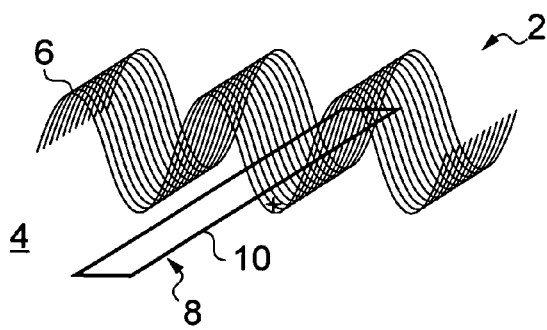
FIG. 3A illustrates the apparatus of FIG. 2A at a second moment in time.
Figure 3B:
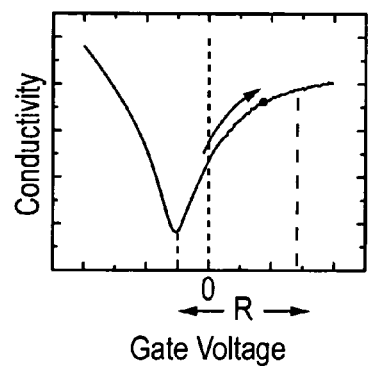
FIG. 3B illustrates the conductivity of a graphene electrode at the second moment in time on a plot illustrating how conductivity varies with electric field for the apparatus illustrated in FIG. 3A.

FIGS. 2A and 3A illustrate an apparatus similar to that illustrated in FIG. 1. The graphene electrode 10 is a two-dimensional electrode 10 that has an electric field dependent conductivity as illustrated in FIGS. 2B and 3B.

As can be seen from FIG. 2B, an electric field generated by the piezoelectric substrate 4 as a consequence of the surface acoustic wave 6 varies across a range R. Over this range R, the conductivity of the graphene electrode 10 varies monotonically (the range does not overlap the Dirac point).

In FIG. 2A, a minimum amplitude of the surface acoustic wave 6 coincides with the position of the graphene electrode 10. The piezoelectric substrate 4 develops a negative voltage which results in a low conductivity of the graphene electrode 10 as illustrated in FIG. 2B.

As the minimum of the surface acoustic wave 6 moves past the position of the graphene electrode 10, the piezoelectric substrate 4 develops an increasing voltage which results in increasing conductivity of the graphene electrode 10.

In FIG. 3A, a maximum amplitude of the surface acoustic wave 6 now coincides with the position of the graphene electrode 10. The piezoelectric substrate develops a maximum positive voltage which results in a maximum conductivity of the graphene electrode 10 as illustrated in FIG. 3B.

Figure 4:
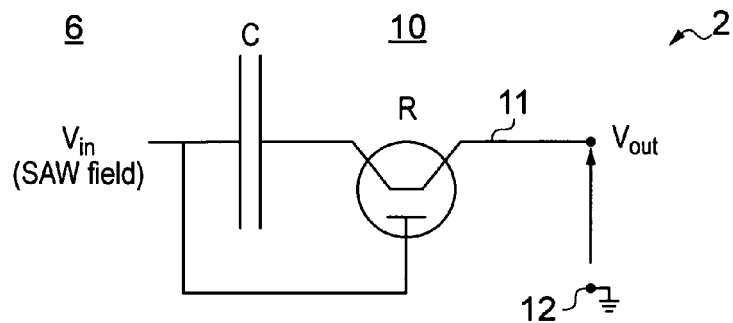
FIG. 4 illustrates an equivalent circuit for a graphene electrode of a surface acoustic wave transducer.

The operation of the transducer 8 may be understood from FIG. 4, which illustrates an equivalent circuit for the graphene electrode 10.

The voltage developed by the piezoelectric substrate 4 as a consequence of the surface acoustic wave is modeled as Vin in FIG. 4.

The coupling between the piezoelectric substrate 4 and the graphene electrode 10 is modeled as capacitance C in FIG. 4.

The electric field dependent conductivity of the graphene electrode 10 is modeled as a gated device having a channel that has a variable transconductance (resistance R), such as a field effect transistor. The gate receives as input the voltage developed by the piezoelectric substrate 4 (Vin). The channel is connected in series with the capacitance C which is in series with the voltage developed by the piezoelectric substrate 4 (Vin).

The channel provides an output signal 11 that develops a voltage Vout relative to the ground reference node 12. The ground reference potential node 12 may be configured to provide a ground reference potential that is independent of the surface acoustic wave 6.

When the maximum amplitude of the surface acoustic wave 6 coincides with the graphene electrode 10, the voltage developed by the piezoelectric substrate 4 (Vin) is minimum and the conductivity of the graphene electrode is minimum. The timing constant RC of the equivalent circuit is maximum.

When the maximum amplitude of the surface acoustic wave coincides with the graphene electrode 10, the voltage developed by the piezoelectric substrate 4 (Vin) is maximum and the conductivity of the graphene electrode is maximum. The timing constant RC is minimum.

It will therefore be appreciated that the RC timing constant is smaller when the capacitance C is charging than when the capacitance C is discharging.

As the oscillations in Vin are more frequent that the timing constant charge accumulates at the capacitance C which produces a direct current output signal 11. Direct current in this context means that the output signal 11 has a sign (polarity) that does not change (toggle).

Figure 5A:
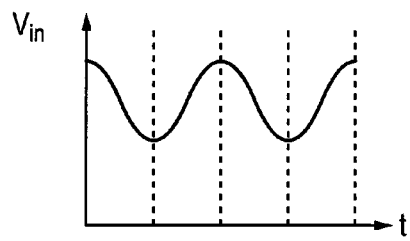
FIG. 5A illustrates an example of a voltage developed by a piezoelectric substrate in response to a propagating surface acoustic wave.

FIG. 5A illustrates an example of a voltage developed by the piezoelectric substrate 4 (Vin) in response to a propagating surface acoustic wave 6. The voltage Vin has a constant frequency and constant amplitude, which may be greater than 1 Ghz or even greater than 1 THz.

Figure 5B:
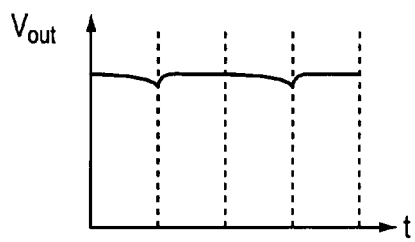
FIG. 5B illustrates a schematic of a possible output signal in response to the voltage illustrated in FIG. 5A.

FIG. 5B illustrates a schematic of a possible output signal 11. The output signal 11 (Vout) has a generally constant value with some fluctuations caused by the charging discharging cycles of the capacitance C. It should be noted that charging is faster than discharging.

The apparatus 2 may therefore be used a rectifier that can operate as high frequencies.

Figure 6A:
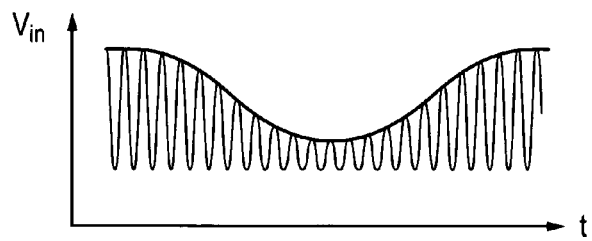
FIG. 6A illustrates an example of a voltage developed by the piezoelectric substrate in response to a propagating modulated surface acoustic wave.
Figure 6B:
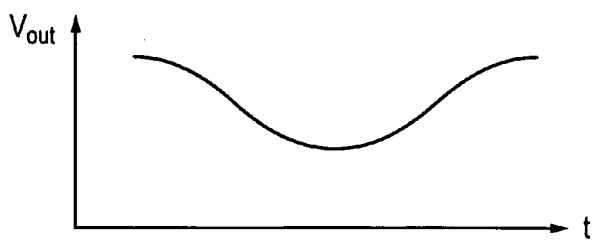
FIG. 6B illustrates a schematic of a possible modulated output signal in response to the voltage illustrated in FIG. 6A.

FIGS. 6A and 6B, illustrates how the apparatus 2 may be used as a demodulator.

FIG. 6A illustrates an example of a voltage developed by the piezoelectric substrate 4 (Vin) in response to a propagating surface acoustic wave 6. The voltage Vin has a constant frequency, which may be greater than 1 Ghz or even greater than 1 THz, and a more slowly modulated amplitude.

FIG. 6B illustrates a schematic of a possible output signal 11. The output signal 11 (Vout) has a value that tracks the slowly modulated amplitude in FIG. 6A.

The apparatus 2 may therefore be used as a demodulator that can operate at high frequencies.

Figure 7A:
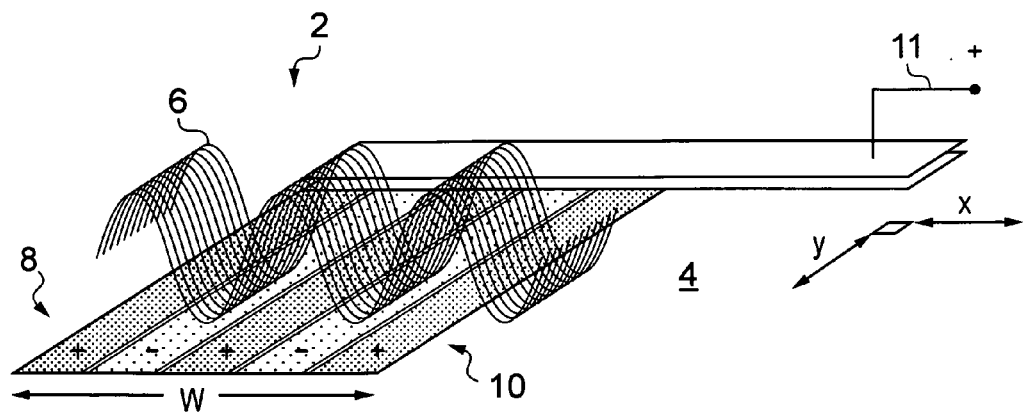
FIG. 7A illustrates, at a first moment in time, a surface acoustic wave transducer that has a wide electrode.
Figure 7B:
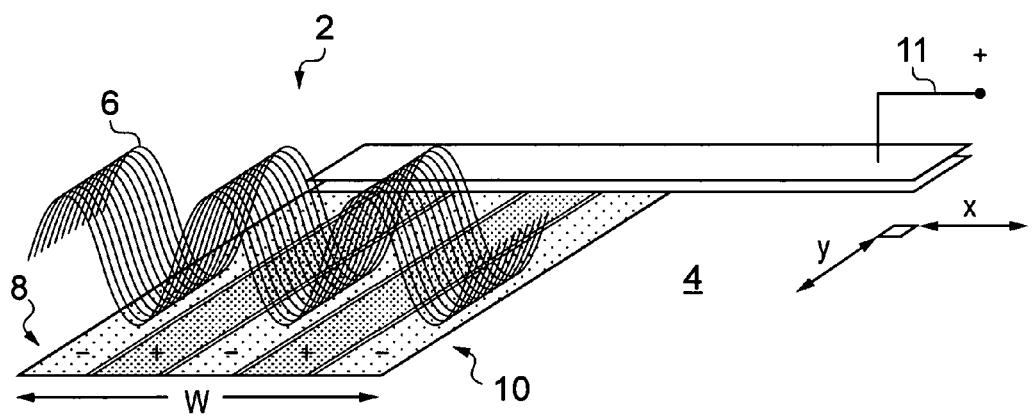
FIG. 7B illustrates the apparatus with the wide electrode at a second moment in time.

FIGS. 7A and 7B illustrate an apparatus 2 similar to that illustrated previously. However, in this example, the graphene electrode 10 that has a large width W.

In this example the graphene electrode 10 has a width W in the first direction X that is N times greater than the wavelength of the propagating surface acoustic wave 6. N is greater than or equal to 1. It may, for example, be greater than or equal to 2, 4 or 10. N may be a whole number.

As the surface acoustic wave propagates past the graphene electrode, it creates an oscillating displacement in the piezoelectric substrate 4 that propagates with the surface acoustic wave 6. The oscillating displacement in the piezoelectric substrate 4 generates a corresponding oscillating local electric field at the graphene electrode 10 that also propagates with the surface acoustic wave 6. The oscillating electric field generates a corresponding oscillating local conductivity in the graphene electrode 10 that also propagates with the surface acoustic wave 6.

The surface acoustic wave 6 therefore creates stripes of different conductivity that are parallel and normal to the direction of propagation of the surface acoustic wave 6. These stripes move with the propagating surface acoustic wave 6. If the width W of the graphene electrode 10 is an integral number of wavelengths λ of the surface acoustic wave, then the number of high and low conductivity stripes remains constant although their position propagates with the surface acoustic wave 6.

The different conductivity induced by the localized piezoelectric field corresponding to the surface acoustic wave, turns the graphene electrode into a superstructure comprising parallel conducting/insulating stripes, following the periodicity of the surface acoustic wave 6. The pattern is dynamic following the propagation of the surface acoustic wave 6.

As there are a constant number of conducting and non-conducting stripes, the combined output signal 11 will have a substantially constant potential.

The conducting stripes contribute most to the output signal 11. If the width W is much greater than the wavelengths λ of the surface acoustic waves 6, then the output signal 11 will have a substantially constant potential for a surface acoustic wave of any constant wavelength.

If the amplitude of the propagating surface acoustic wave is modulated slowly then the output signal 11 will track the modulation signal. The apparatus 2 may therefore be used as a de-modulator.

The wider graphene electrode 10 may be a sole electrode 10. That is the transducer 8 may only comprise a single graphene electrode 10.

Figure 8:
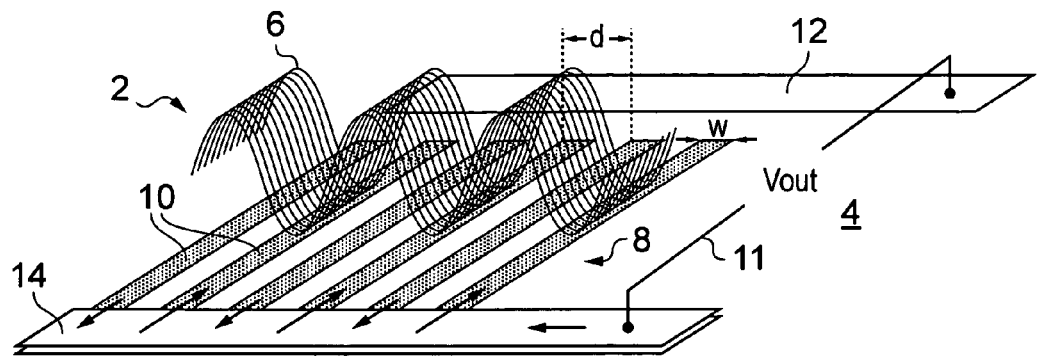
FIGS. 8, 9 and 10 illustrate different embodiments of the apparatus in which a surface acoustic wave transducer comprises a plurality of parallel electrodes.
Figure 9:
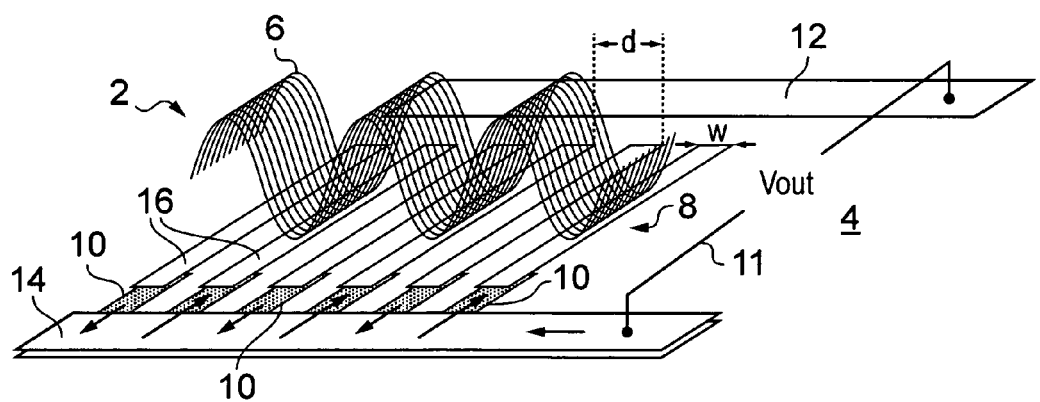
Figure 10:
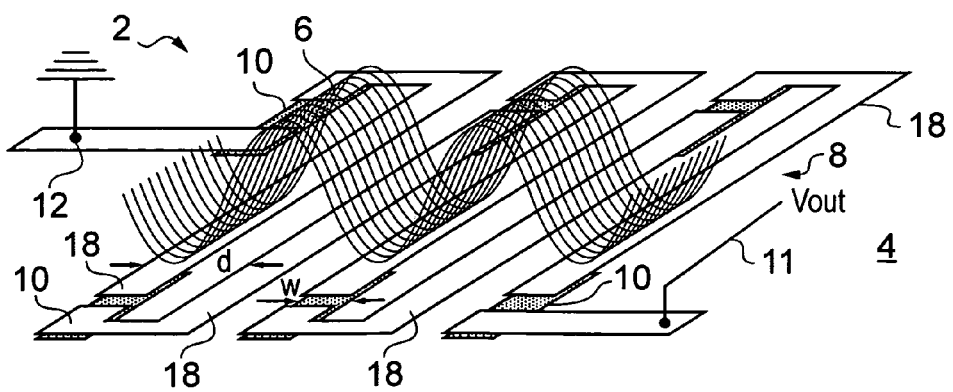

In FIGS. 8, 9 and 10 the transducer 8 comprises a plurality of parallel graphene electrodes 10 each configured to transduce a propagating surface acoustic wave 6 to an electrical signal 11.

As in the previous Figures, the plurality of parallel graphene electrodes 10 extend in a second direction Y that is orthogonal to a first direction X in which the surface acoustic wave 6 propagates. The plurality of parallel graphene electrodes 10 are electrically interconnected.

Each of the plurality of parallel graphene electrodes 10 has a width w in the first direction which may be less than one half the maximum wavelength of the surface acoustic waves 6.

The plurality of parallel graphene electrodes 10 may have a regular periodicity with a separation d between them. The separation d may be one wavelength of the surface acoustic wave. The distance d is used to tune the transducer 8 to a particular frequency of surface acoustic wave, allowing the apparatus 2 to operate as a filter or detector.

A ground reference potential node 12 is, in these examples, configured to provide a ground reference potential that is independent of the surface acoustic wave 6.

In FIGS. 8 and 9, the plurality of parallel graphene electrodes 10 are aligned in the first direction and are electrically interconnected in electrical parallel to output an electric voltage as the signal 11. The output voltage is provided between a metal connector 14 from which the plurality of parallel graphene electrodes 10 extend and the ground reference potential node 12. The metal connector extends parallel to the first direction X in which the surface acoustic wave 6 is propagating. The output voltage may be a direct current voltage that is less than a voltage capable of operating a Schottky diode (e.g. less than 200 mV).

In FIG. 8, the plurality of parallel graphene electrodes 10 extend from the metal connector 14 and terminate in free space.

In FIG. 8, each of the plurality of parallel graphene electrodes 10 extend from the metal connector 14 and couple to a respective one of a plurality of parallel metal electrodes 16 that extend in the second direction Y and terminate in free space. The plurality of parallel graphene electrodes 10 form bridges between the metal electrodes 16 and the metal connector 14.

In FIG. 10, the plurality of parallel graphene electrodes 10 are electrically interconnected in electrical series to output an electric current as the signal 11.

The plurality of parallel graphene electrodes 10 can be divided into an odd set and an even set. Odd ones of the plurality of parallel graphene electrodes 10 are aligned with each other in the first direction. Even ones of the plurality of parallel graphene electrodes 10 are aligned with each other in the first direction but are not aligned with the odd ones.

Metal interconnect connects each odd graphene electrode to its next adjacent even graphene electrode. Metal interconnect connects each even graphene electrode to its next adjacent odd graphene electrode.

In this configuration, the apparatus 2 operates as a charge pump.

Figure 11:
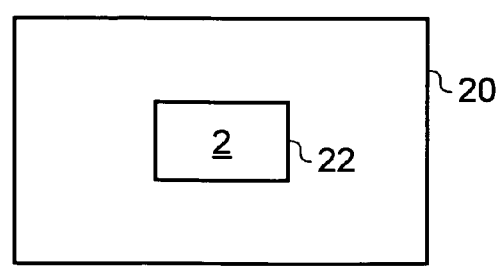
FIG. 11 illustrates a device comprising the apparatus.

FIG. 11 illustrates an example of the apparatus 2 configured as a module 22.

The module may, for example, be part of a larger device 20 such as an analog signal processor, a high-frequency rectifier, an energy harvester, a demodulator, or a receiver.

As used here 'module' refers to a unit or apparatus that excludes certain parts/components that would be added by an end manufacturer or a user.

The receiver may operate by using the piezoelectric substrate 4 to convert incident microwaves into surface acoustic waves 6 which can then be converted to an electrical signal by the apparatus 2.

Although embodiments of the present invention have been described in the preceding paragraphs with reference to various examples, it should be appreciated that modifications to the examples given can be made without departing from the scope of the invention as claimed. For example, although a graphene electrode 10 is illustrated other two-dimensional electrodes 10 may be used. It is preferable to use an electrode with a high electron mobility that varies with local piezoelectric potential.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
    a piezoelectric substrate configured to propagate a surface acoustic wave;
    a transducer, coupled to the piezoelectric substrate, comprising at least one graphene electrode configured to transduce a propagating surface acoustic wave to an electrical signal; and
    a ground reference potential node configured to provide a ground reference potential that is independent of the surface acoustic wave;
    wherein the at least one graphene electrode comprises a two-dimensional graphene ribbon monolayer configured to be a semiconductor with zero band gap;
    wherein the transducer is configured to transduce a propagating surface acoustic wave to an output direct current electrical signal;
    wherein the propagating surface acoustic wave has a frequency of greater than 1 THz; and
    wherein the piezoelectric substrate and the at least one graphene electrode are coupled to form a channel having a variable transconductance that provides an output signal that develops an electric voltage relative to the ground reference potential node.

2. An apparatus as claimed in claim 1, wherein the graphene electrode is a two-dimensional electrode having an electric field dependent conductivity.

3. An apparatus as claimed in claim 1, wherein the graphene electrode is coupled to the piezoelectric substrate and has a conductivity that is dependent upon a coupled electric field such that a varying electric field at the piezoelectric substrate, caused by a propagating surface acoustic wave, is coupled to the graphene electrode to vary the conductivity of the graphene electrode.

4. An apparatus as claimed in claim 3, wherein the varying electric field at the piezoelectric substrate is within a range within which the change in conductivity of the graphene with electric field is monotonic.

5. An apparatus as claimed in claim 1, wherein the transducer comprises a plurality of parallel graphene electrodes each configured to transduce a propagating surface acoustic wave to an electrical signal.

6. An apparatus as claimed in claim 5, wherein the plurality of parallel graphene electrodes extend in a second direction that is orthogonal to a first direction in which the surface acoustic wave propagates.

7. An apparatus as claimed in claim 5, wherein the plurality of parallel graphene electrodes are electrically interconnected.

8. An apparatus as claimed in claim 7, wherein the plurality of parallel graphene electrodes are electrically interconnected in electrical parallel to provide the output signal that develops the electric voltage.

9. An apparatus as claimed in claim 7, wherein the plurality of parallel graphene electrodes are electrically interconnected in electrical series to output an electric current.

10. An apparatus as claimed in claim 1 wherein the transducer is configured to transduce surface acoustic waves having a maximum wavelength and wherein the graphene electrode has a width in a direction of propagation of the surface acoustic waves greater than or equal to N times the maximum wavelength, where N is greater than or equal to 1.

11. An apparatus as claimed in claim 10 wherein N is greater than or equal to 2.

12. An apparatus as claimed in claim 1, wherein the transducer is configured to transduce, at room temperature, a propagating surface acoustic wave to an electrical signal.

13. An apparatus as claimed in claim 1, configured as a module.

14. An apparatus as claimed in claim 1, comprised within an analog signal processor, a high-frequency rectifier, an energy harvester, a demodulator, or a receiver.

15. An apparatus comprising:
a piezoelectric substrate configured to propagate a surface acoustic wave;
a transducer, coupled to the piezoelectric substrate, comprising at least one electrode configured to transduce a propagating surface acoustic wave to an output direct current electrical signal; and
a ground potential reference node configured to provide a ground potential reference that is independent of the surface acoustic wave, wherein the electrode is coupled to the piezoelectric substrate and has a conductivity that is dependent upon a coupled electric field such that a varying electric field at the piezoelectric substrate, caused by a propagating surface acoustic wave, is coupled to the electrode and varies the conductivity of the electrode, and wherein the electrode comprises a two-dimensional graphene ribbon monolayer configured to be a semiconductor with zero band gap;
wherein the propagating surface acoustic wave has a frequency of greater than 1 THz; and
wherein the piezoelectric substrate and the at least one electrode are coupled to form a channel having a variable transconductance that provides an output signal that develops an electric voltage relative to the ground potential reference node.

16. An apparatus comprising:
a piezoelectric substrate configured to propagate a surface acoustic wave;
a transducer, coupled to the piezoelectric substrate, and configured to transduce a propagating surface acoustic wave to an output direct current electrical potential, the transducer comprising an electrode comprising a two-dimensional graphene ribbon monolayer configured to be a semiconductor with zero band gap; and
a ground potential node configured to provide a ground potential that is independent of the surface acoustic wave;
wherein the propagating surface acoustic wave has a frequency of greater than 1 THz; and
wherein the piezoelectric substrate and the electrode are coupled to form a channel having a variable transconductance that provides an output signal that develops an electric voltage relative to the ground potential node.

17. An apparatus comprising:
a piezoelectric substrate configured to propagate a surface acoustic wave; and
a transducer, coupled to the piezoelectric substrate, and configured to transduce a propagating surface acoustic wave to an output direct current electrical potential, the transducer comprising an electrode comprising a two-dimensional graphene ribbon monolayer configured to be a semiconductor with zero band gap;
wherein the propagating surface acoustic wave has a frequency of greater than 1 THz; and
wherein the piezoelectric substrate and the electrode are coupled to form a channel having a variable transconductance that provides an output signal that develops an electric voltage relative to a ground potential node.

* * * * *